(12) United States Patent
Miyaguchi (10) Patent No.: US 7,705,317 B2
(45) Date of Patent: Apr. 27, 2010

(54) RADIATION IMAGING DEVICE AND RADIATION IMAGING METHOD

(75) Inventor: Kazuhisa Miyaguchi, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 11/660,366

(22) PCT Filed: Aug. 4, 2005

(86) PCT No.: PCT/JP2005/014323

§ 371 (c)(1),
(2), (4) Date: Aug. 23, 2007

(87) PCT Pub. No.: WO2006/018983

PCT Pub. Date: Feb. 23, 2006

(65) Prior Publication Data

US 2008/0067392 A1    Mar. 20, 2008

(30) Foreign Application Priority Data

Aug. 20, 2004   (JP) .............................. 2004-241272

(51) Int. Cl.
*G01T 1/20* (2006.01)
(52) U.S. Cl. ................................. 250/370.11
(58) Field of Classification Search ............ 250/370.11
See application file for complete search history.

(56) References Cited

U.S. PATENT DOCUMENTS

| | | | |
|---|---|---|---|
| 5,041,729 A * | 8/1991 | Takahashi et al. ...... | 250/370.11 |
| 5,043,582 A * | 8/1991 | Cox et al. ............... | 250/370.09 |
| 5,548,123 A * | 8/1996 | Perez-Mendez et al. ..................... | 250/370.11 |
| 2003/0169847 A1* | 9/2003 | Karellas et al. ............ | 378/98.3 |

FOREIGN PATENT DOCUMENTS

| | | |
|---|---|---|
| EP | 933650 A2 * | 8/1999 |
| JP | 59-149076 | 10/1984 |
| JP | 5-505025 | 7/1993 |
| JP | 2001-330678 | 11/2001 |
| JP | 2002-14168 | 1/2002 |
| JP | 2002-48870 | 2/2002 |
| JP | 2003-60181 | 2/2003 |

* cited by examiner

*Primary Examiner*—David P Porta
*Assistant Examiner*—Shun Lee
(74) *Attorney, Agent, or Firm*—Drinker Biddle & Reath LLP (57) ABSTRACT

A radiation imaging device which, as a whole, can be further reduced in size and thickness with the area of an imaging area sufficiently achieved. A scintillator film 2 emitting light with a predetermined wavelength in response to an incident of radiation is accommodated in a case 5 while being sandwiched between an image sensor 1 and a circuit board 3. The image sensor 1 is provided such that its photodetecting section 11 is in contact with the scintillator film 2 and its electrode section 12 is projected and exposed to the outside from the scintillator film 2. The electrode section 12 is electrically connected by a wire 6 to an electrode section 32 of the circuit board 3.

8 Claims, 10 Drawing Sheets

RADIATION IMAGING DEVICE AND RADIATION IMAGING METHOD

TECHNICAL FIELD

The present invention relates to a radiation imaging device which acquires a radiation image as an image signal and a radiation imaging method using this device, and more specifically, to a radiation imaging device which can be reduced in size and thickness to be suitably used to acquire a radiation image of teeth by being inserted into the oral cavity, and a radiation imaging method using this device.

BACKGROUND ART

Radiation imaging systems using CCDs in place of X-ray sensitive films have spread as medical X-ray diagnostic apparatuses. In such a radiation imaging system, two-dimensional radiation image data is acquired as electrical signals by using a radiation imaging device having a plurality of pixels, and the signals are processed by a processor and displayed on a monitor.

As a radiation imaging device such as a dental device which is used by being inserted into the oral cavity, there is known a radiation imaging device of a type disclosed in Patent Document 1. In this radiation detector, an image sensor including a solid-state image pickup device such as a CCD is disposed on a wiring substrate made of ceramic, glass, or epoxy, and a scintillator which converts radiation into light such as visible light detectable by the image sensor is disposed on a photosensitive surface of the image sensor.

Patent Document 1: Japanese Published Unexamined Patent Application No. 2001-330678

DISCLOSURE OF THE INVENTION

Problem to be Solved by the Invention

It has been demanded to reduce the size and thickness as small as possible of such a type of radiation imaging device to be inserted into the oral cavity. On the other hand, it has been demanded to increase its imaging area as large as possible. Therefore, it becomes necessary to make a projection area of the main body on the same surface as the imaging surface as close to the area of the image sensor as possible.

The radiation imaging device disclosed in Patent Document 1 is reduced in size and thickness more than conventional imaging devices, however, the base on which the image sensor is placed is wider laterally than the image sensor, and it is difficult to further reduce the size and thickness while maintaining the size of the imaging area.

Therefore, an object of the invention is to provide a radiation imaging device which can further be reduced in size and thickness while maintaining the size of the imaging area and a radiation imaging method using this radiation imaging device.

Means for Solving the Problem

To solve the above-described problem, a radiation imaging device according to the invention includes (1) a planar scintillator film which emits light with a predetermined wavelength in response to an incident of X-ray; (2) an image sensor which includes a photodetecting section for detecting the light with a predetermined wavelength emitted from the scintillator film and an electrode section on one of the surfaces of a substrate, where the photodetecting section is in tight contact with one of the surfaces of the scintillator film and the electrode section is exposed to the outside of the scintillator film; and (3) a circuit board which is disposed on the other surface of the scintillator film and has an electrode section electrically connected to the electrode section of the image sensor.

In this radiation imaging device, a construction in which the scintillator film is sandwiched by the image sensor and the circuit board is employed. In the construction, the electrode section of the image sensor projected and exposed to the outside from the scintillator film is electrically connected to the circuit board on the opposite side across the scintillator film by a wire or the like.

It is preferable that the radiation imaging device further includes a case which houses all of the scintillator film, the image sensor, and the circuit board, and at least whose radiation incident surface is radiolucent. The whole of this case may be radiolucent, or the surface opposite the radiation incident surface may be non-radiolucent. It is preferable that the case has a moisture-proof structure.

A radiation imaging method according to the invention is a radiation imaging method for acquiring a radiation image as an image signal by using the radiation imaging device according to the invention, including the steps of: (1) making a radiation image enter the image sensor from a surface opposite a photodetecting section forming surface and transmitting it through the image sensor; (2) converting the radiation image into an optical image of light with a predetermined wavelength in the scintillator film by radiation that has reached the scintillator film; (3) detecting the generated optical image by the photodetecting section of the image sensor; and (4) transmitting the detected image signal from the electrode section of the image sensor to the circuit board and acquiring it through the circuit board.

Effect of the Invention

According to the invention, in the imaging device, the constituent section being present in a region projecting to the outside from the scintillator film can be limited to only the electrode section of the image sensor. Therefore, the region projecting to the outside of the photosensitive area can be reduced, so that the size of the whole device can be reduced. In addition, a circuit board is formed on the scintillator film, so that a thin circuit board can be used, and the whole device can be reduced in thickness. With this arrangement, wiring of the electrode section of the image sensor and the electrode section of the circuit board also becomes easy.

By housing the device in a case whose radiation incident surface is radiolucent, the device is improved in moisture resistance and durability, and handling of the device becomes easy. Particularly, as a radiation imaging device of a type to be inserted in the oral cavity, by forming the device into a shape with no unevenness on its outer side, the burden on an examinee is reduced, and the degree of freedom at the time of imaging is increased.

By making radiation enter the image sensor from the back side of the image sensor, low energy radiation which causes noises can be blocked. Therefore, a radiation image which reaches the scintillator film can be made clear, and an optical image generated thereby has less noise, so that the image sensor can detect a clear image.

DESCRIPTION OF SYMBOLS

1: image sensor
2: scintillator film
3: circuit board
4: rubber sheet
5: case
5a: incident surface
6: wire
7: examinee
8: radiation source
10: silicon substrate
10a: incident surface
11: photodetecting section
12: electrode section
20: supporting substrate
21: scintillator
22: protective coat
30: substrate
31: circuit part
32: electrode section
33: output terminal
34: output cable
90: processor
91: monitor
100: radiation imaging device
200: imaging section

BEST MODES FOR CARRYING OUT THE INVENTION

Hereinafter, a preferred embodiment of the invention will be described in detail with reference to the accompanying drawings. For easy understanding of the description, the same components among the drawings are attached with the same reference numerals to the extent possible, and overlapping description will be omitted.

Figure 1:
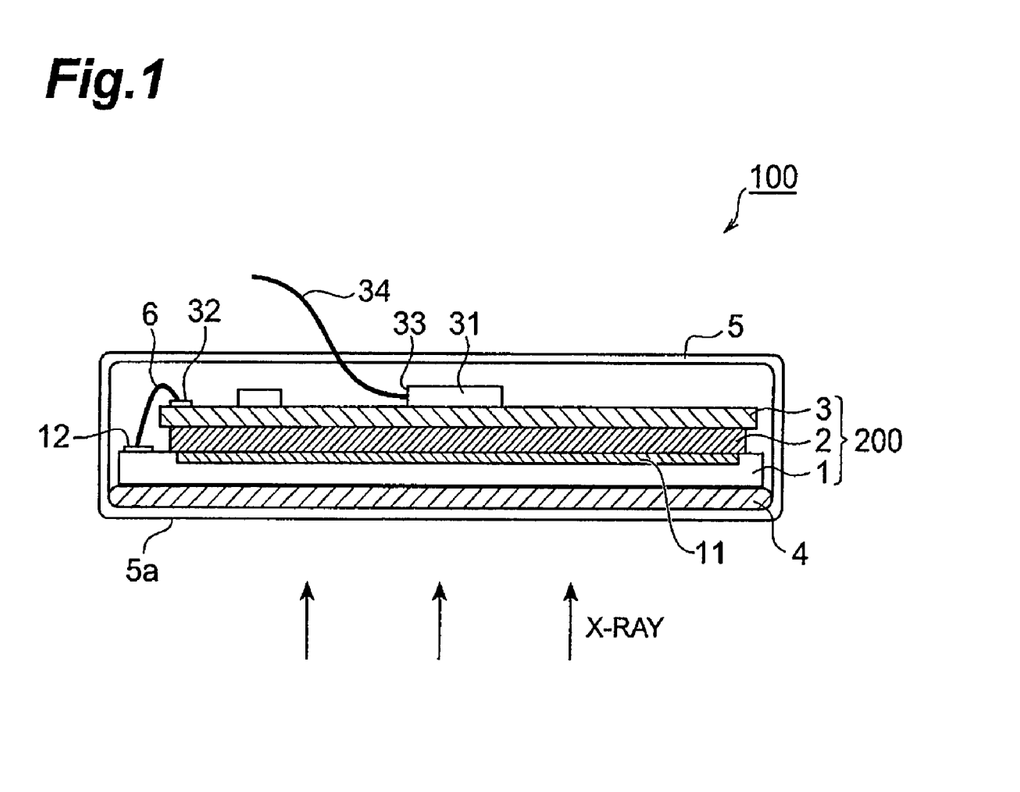
FIG. 1 is a longitudinal sectional view of a radiation imaging device 100 according to the invention.
Figure 2:
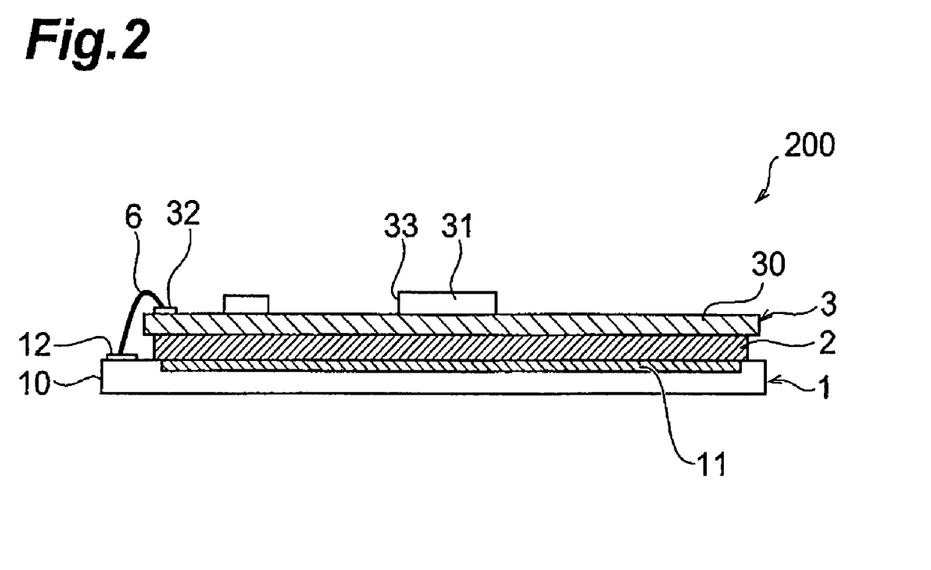
FIG. 2 is a longitudinal sectional view of an imaging section 200 housed inside a case 5 of the device of FIG. 1.

FIG. 1 is a longitudinal sectional view of a radiation imaging device 100 according to the invention, and FIG. 2 is a longitudinal sectional view of an imaging section 200 housed inside a case 5 shown in FIG. 1. This radiation imaging device 100 includes the imaging section 200 housed inside the resin-made case 5, and the imaging section 200 is placed on a protective rubber sheet 4. This radiation imaging device 100 is inserted into the oral cavity of an examinee to acquire a radiation image of teeth, etc., of the examinee, and the case surface on the rubber sheet 4 side is an incident surface 5a.

The imaging section 200 is constructed by laminating a scintillator film 2 and a circuit board 3 on an image sensor 1. The image sensor 1 has a photodetecting section 11 obtained by forming a CCD (Charge Coupled Device) on a rectangular planar silicon substrate 10, and along one of the shorter sides, a signal reading and sensor controlling electrode section (bonding pad) 12 is formed.

Figure 3:
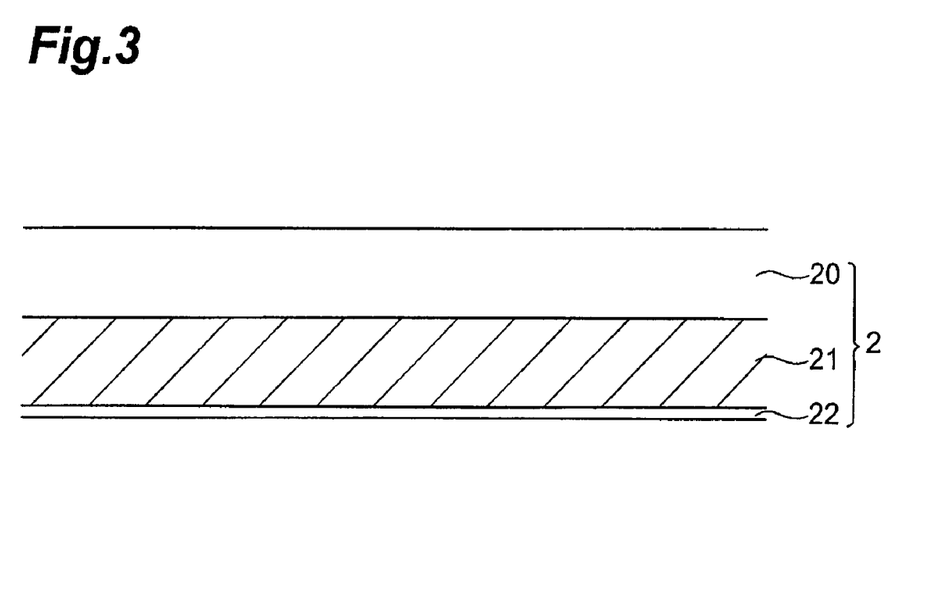
FIG. 3 is a longitudinal sectional view showing a construction of a scintillator film 2 of the device of FIG. 1.

The scintillator film 2 has a three-layer laminated structure as shown in FIG. 3 in which scintillator 21 is deposited on a supporting substrate 20 and the surface thereof is covered by a protective coat 22. As the supporting substrate 20, for example, plastic is used, however, ceramic or glass, or a light reflective metal substrate such as aluminum can also be used. As a material of the scintillator 21, Tb-doped $Gd_2O_2S$ or Tl-doped CsI can be used. As the protective coat 22, a transparent organic coat or an inorganic coat is used, and preferably, this coat is water impermeable. For example, PET (polyethylene terephthalate) and a parylene-based resin can be used, and among polyparaxylylene resins (made by Three Bond Co., Ltd., trade name: Parylene), polyparachloroxylylene (made by Three Bond Co., Ltd., trade name: Parylene C) or the like is preferable.

The circuit board 3 includes a substrate 30 formed of an FPC (Flexible Printed Circuit) board, PCB (Printed Circuit board), or ceramic board on which electronic parts are mounted, a circuit part 31 mounted on the substrate, and an electrode section 32. The electrode section 12 of the image sensor 1 and the corresponding electrode section 32 of the circuit board 3 are electrically connected by a wire 6. To the output terminal 33 provided on a predetermined circuit part 31 of the circuit board 3, an output cable 34 is connected, and the cable is drawn to the outside of the case through the case 5 and connected to a processor or a display unit that is not shown.

Figure 4:
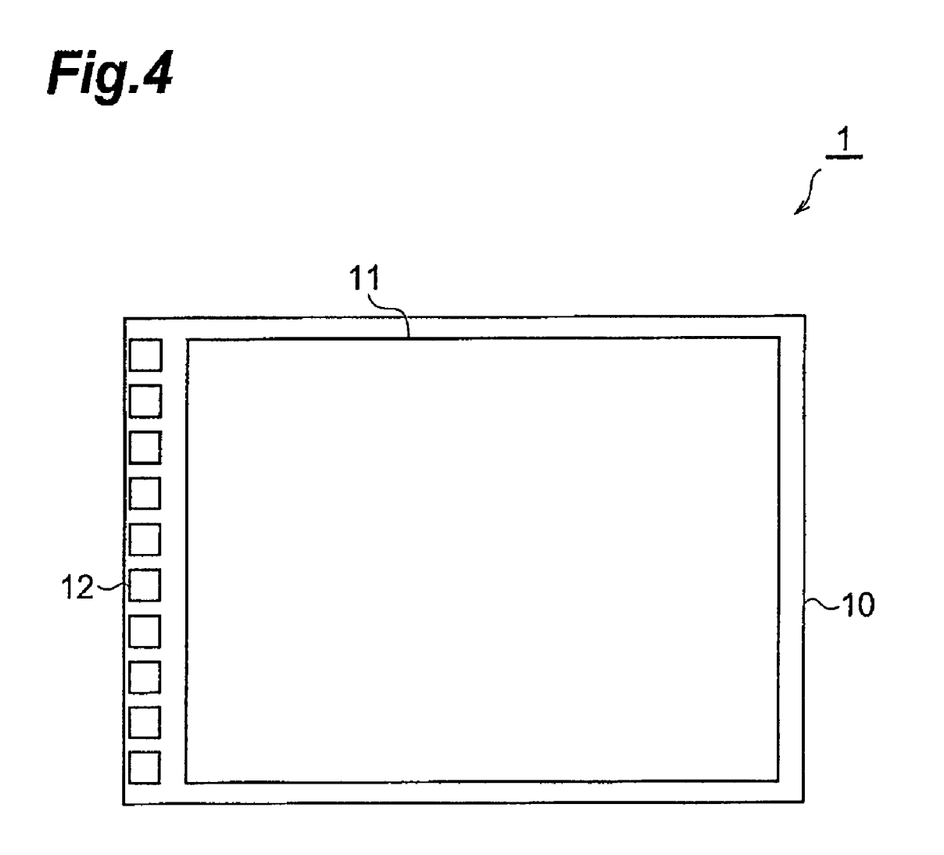
FIG. 4 is a plan view of an image sensor 1 to be used in the device of FIG. 1.
Figure 5:
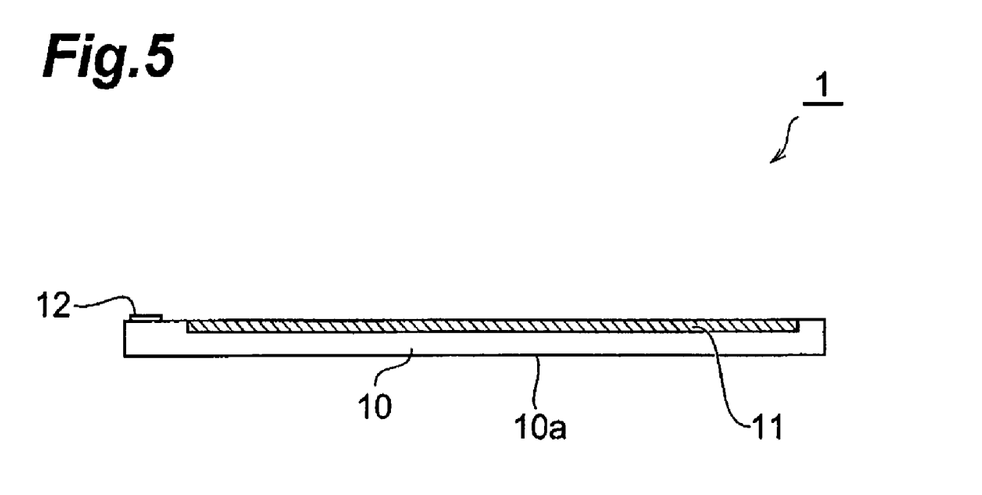
FIG. 5 is a longitudinal sectional view of FIG. 4.

Next, a method for manufacturing this radiation imaging device will be described in detail. First, the image sensor 1 shown in FIG. 4 and FIG. 5 is prepared. This image sensor 1 is obtained by forming a photodetecting section 11 including two-dimensionally aligned photosensitive pixels and an electrode section 12 electrically connected to the photodetecting section by using the normal semiconductor manufacturing process on a silicon wafer and dividing the wafer into chips by dicing. An effective photosensitive region of the photodetecting section 11 is about 30 mm×20 mm, and the area of the substrate 10 is about 32mm×22 mm. The photodetecting section 11 is biased toward one of the shorter sides of the rectangular substrate 10, and along the other shorter side, the electrode section 12 is disposed. The thickness of the substrate 10 is approximately 600 through 700 μm at the end of the semiconductor manufacturing process, however, preferably, by reducing the thickness of the opposite surface (incident surface) 10a of the photodetecting section 11 by polishing to about 300 μm, the device can further be reduced in thickness.

Figure 6:
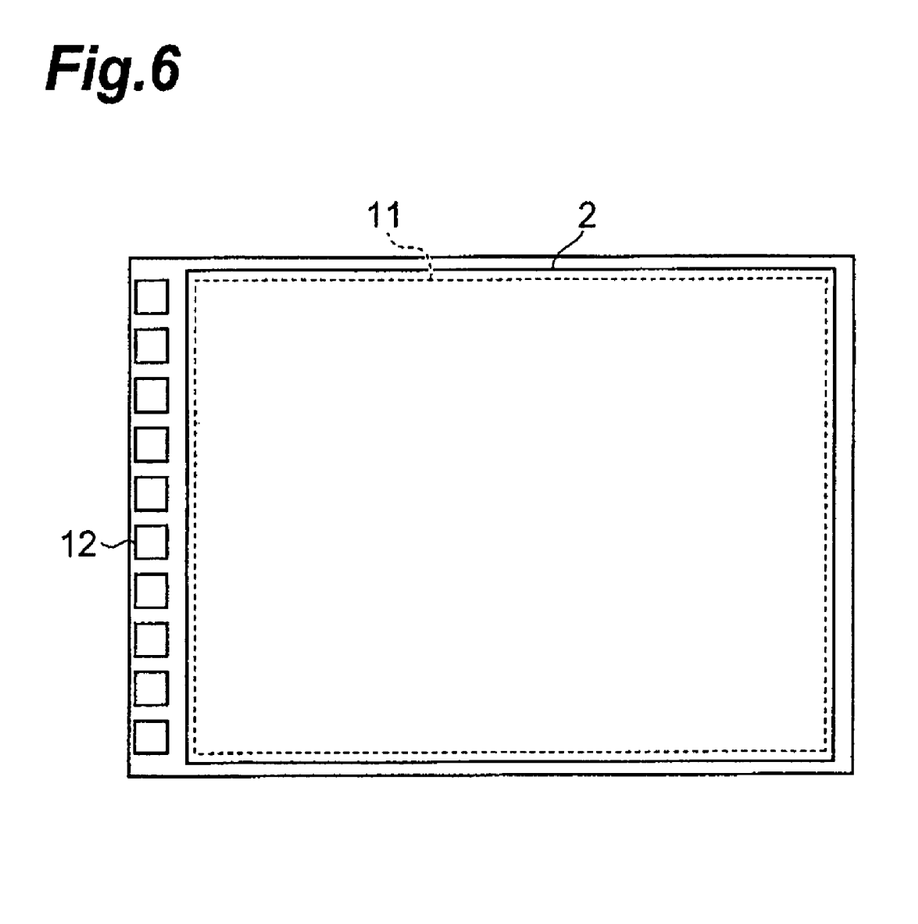
FIG. 6 is a plan view showing a state that the scintillator film 2 is affixed to the image sensor 1 of FIG. 4.
Figure 7:
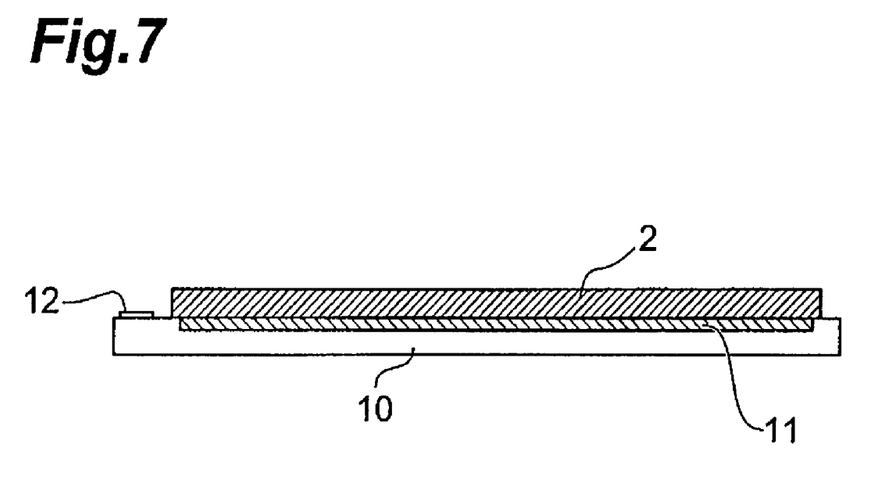
FIG. 7 is a longitudinal sectional view of FIG. 6.

Next, a scintillator film 2 (with a thickness of about 300 μm) slightly larger in size (31 mm×21 mm) longitudinally and laterally than the photodetecting section 11 of the image sensor 1 is prepared and affixed by an adhesive or resin, etc., so that the protective coat 22 thereof is turned toward the photodetecting section 11 side so as to cover the photodetecting section 11 (see FIG. 6 and FIG. 7). The thicknesses of the supporting substrate 20, the scintillator 21, and the protective coat 22 of the scintillator film 2 are, for example, 150 μm, 150 μm, and 10 μm, respectively. As this adhesive or resin, one having a property to transmit light emitted from the scintillator 21 when it is cured is selected. Then, to prevent the adhesive or resin from adhering to the electrode section 12 and reliably expose the electrode section 12, at the time of affixing (applying when the adhesive or resin is applied to the image sensor 1 side), the electrode section 12 and the surrounding thereof are masked.

Figure 8:
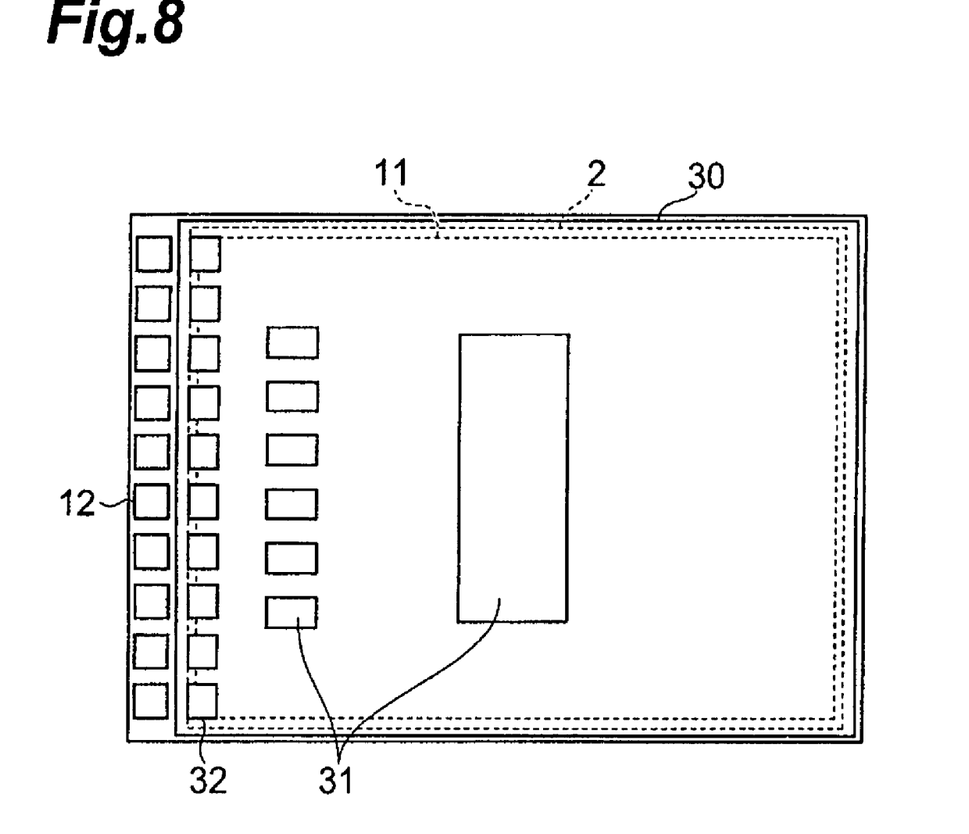
FIG. 8 is a plan view showing a state in that a circuit board 3 is mounted on the scintillator film 2 of FIG. 6.
Figure 9:
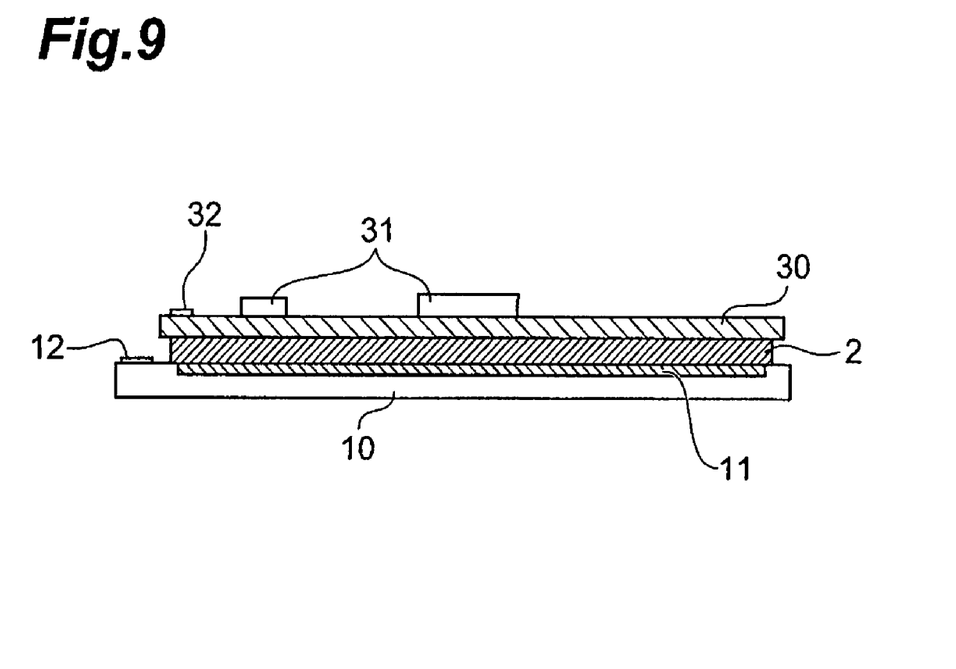
FIG. 9 is a longitudinal sectional view of FIG. 8.

Next, a circuit board 3 on which parts have been mounted is bonded onto the scintillator film 2 (see FIG. 8 and FIG. 9). It is also possible that the circuit board 3 is bonded onto the substrate 20 of the scintillator film 2 in advance and then affixed onto the image sensor 1. At this point, the electrode section 32 of the circuit board 3 is disposed on the electrode section 12 side of the image sensor 1 so that the corresponding electrodes face each other. Then, the corresponding electrodes are connected by the wire 6. At this time, wiring is performed while taking care to prevent the wire 6 from projecting to the outside from the electrode section 12.

Thereby, the imaging section 200 shown in FIG. 2 is obtained. The thickness of the circuit board 3 on which parts have been mounted is about 500 μm, so that the thickness of the whole imaging section 200 can be greatly reduced to as thin as about 1.1 mm. The region of the imaging section 200 projecting to the outside from the effective photosensitive region can be reduced, and the wire 6 does not project to the outside from the image sensor 1, so that the imaging section 200 is reduced in size.

The imaging section 200 thus manufactured is placed on the rubber sheet 4 inside the case 5 the cable 34 is connected to the output terminal 33, and the case 5 is closed tightly while the cable 34 penetrates the case 5. Thereby, the radiation imaging device 100 according to the invention shown in FIG. 1 is obtained.

The thickness of about 200 μm of the rubber sheet 4 is sufficient, and the thickness of the outer coat of the case 5 is set to about 0.5 mm, so that the thickness of the whole radiation imaging device 100 can be made equal to or less than 3 mm, whereby sufficient reduction in thickness and size is realized.

Figure 10:
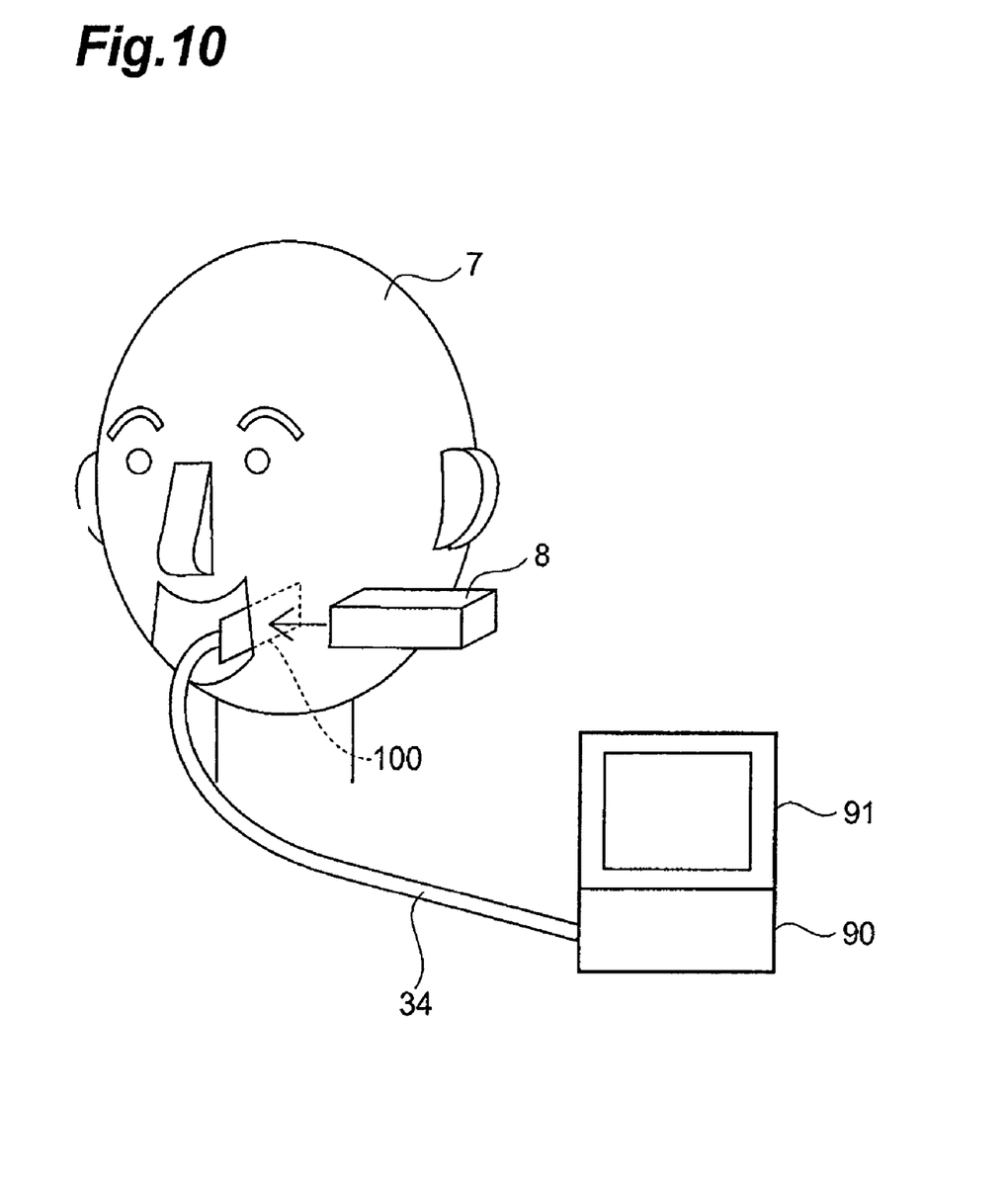
FIG. 10 is a drawing describing usage of the device of FIG. 1.

Next, a radiation imaging method using this radiation imaging device will be described with reference to FIG. 10. The radiation imaging device 100 is located inside the oral cavity of an examinee 7 and radiation is projected from the radiation source 8 to the radiation imaging device 100. At this time, the incident surface 5a side is disposed on the radiation source 8 side. The radiation imaging device 100 is small in size and thickness, and this allows advantages such that the foreign body sensation that the examinee 7 feels when the radiation imaging device is inserted into the oral cavity of the examinee 7 can be reduced, and the degree of freedom when the device is located inside the oral cavity is improved.

When the radiation emitted from the radiation source 8 enters the inside of the oral cavity of the examinee 7, it is absorbed by the teeth and gums, and while having radiation image information according to these, the radiation enters the radiation imaging device 100. The radiation that has entered from the incident surface 5a passes though the case 5 and the rubber sheet 4 and then enters the incident surface 10a of the image sensor 1 of the imaging section 200. When passing through the image sensor 1, low energy radiation is absorbed, and high energy radiation enters the scintillator film 2.

The radiation that has entered the scintillator film 2 passes through the protective coat 22 thereof, and is absorbed by the scintillator 21, and light with a predetermined wavelength according to the energy amount (in this embodiment, light with a wavelength of about 550 nm) is emitted. The emitted light directly enters or is reflected by the supporting substrate 20 and enters the photodetecting section 11 of the image sensor 1, and converted into electrical signals in the respective pixels. The light that has reached the photodetecting section 11 is an optical image including original radiation image information, and the electrical signals obtained in the respective pixels according to this light correspond to the original radiation image.

The converted electrical signals are transferred to the electrode section 12 through the respective pixels and a transfer line that is not shown, and further transferred to the circuit board 3 via the wire 6 and the electrode section 32, and after being subjected to predetermined signal processing, transferred to an external processor 90 by the output cable 34 connected to the output terminal 33. In the processor 90, the transferred image information is accumulated and stored in an external storage device and the radiation image is displayed on the monitor 91 based on the image information.

According to the radiation imaging device 100 of the invention, by shielding low energy radiation by the substrate of the image sensor 1, noise components are reduced and a clear radiation image can be obtained. In addition, in light emitted by the scintillator 21 of the scintillator film 2, by reflecting and guiding light that advances in the direction opposite the image sensor 1 by the substrate 20 to the image sensor 1, the light emitted from the scintillator 21 can be guided to the image sensor 1, so that the optical output can be increased and a clear and high-contrast image can be obtained. Therefore, the radiation amount can be made small, and the radiation exposure amount of an examinee and an operator can be reduced.

In the description given above, the scintillator film 2 is used, however, it is also possible that a scintillator material is directly deposited on the photodetecting section 11 of the image sensor. In this case, a protective coat is formed on the scintillator, and preferably, the protective coat is formed into a multilayer structure and a reflective film is formed between layers. If sufficient moisture-proof and airtightness are secured by the case, the protective coat is not always necessary.

In the description given above, an example using a CCD as an image pickup device is described, however, a CMOS (Complementary Metal Oxide Semiconductor) and other solid-state image pickup devices may also be used. The light emitted by the scintillator in response to the incident of radiation is not limited to visible light, and it may be an infrared ray or ultraviolet ray as long as it has a wavelength in a range detectable by the image sensor.

The above-described device includes a planar scintillator film 2, an image sensor 1 including a photodetecting section 11 in tight contact with one of the surfaces of the scintillator film 2 and an electrode section 12 exposed to the outside of the scintillator film 2, a circuit board 3 which is disposed on the other surface of the scintillator film 2 and has an electrode section 32 electrically connected to the electrode section 12 of the image sensor 1, a case 5 which houses all of the scintillator film 2, the image sensor 1, and the circuit board 3 and at least whose radiation incident surface is made of a radiolucent material, and a protective sheet 4 interposed between the inner surface of the case 5 and the scintillator film 2. As the radiolucent material, a plastic resin, etc., can be used. As the material of the sheet 4, urethane, silicone rubber, etc., are used, which is made of a radiolucent elastic material. In this device, while maintaining the size of the imaging area, the whole device can further be reduced in size and thickness, and the radiation incident surface can be made thin and reinforced by the sheet 4 made of an elastic material, and in addition, the sheet 4 can protect the scintillator film 2 and the image sensor 1, whose mechanical strength is low, by an elastic force.

INDUSTRIAL APPLICABILITY

The present invention can be used for a radiation imaging device and a radiation imaging method using this device.

The invention claimed is:

1. A radiation imaging device comprising:
a rectangular-shaped planar scintillator film which emits light with a predetermined wavelength in response to an incident of X-ray;
an image sensor which includes:
  a rectangular-shaped silicon substrate having an X-ray incident surface,
  a photodetecting section arranged opposite side to the X-ray incident surface for detecting the light with a predetermined wavelength emitted by the scintillator film, and
  an electrode section arranged on a same side as the photodetecting section of the silicon substrate,
  where the photodetecting section is in contact with one of the surfaces of the scintillator film, and the electrode section is exposed to the outside of the scintillator film; and
  a circuit board having a circuit part and an electrode section both are mounted on one of surfaces of a substrate, the other of the surfaces of the substrate of the circuit board covering whole area of the scintillator film, the circuit board being disposed on the other surface of the scintillator film the electrode section of the circuit board being electrically connected to the electrode section of the image sensor by a wire, the electrode section of the image sensor and the electrode section of the circuit board being laterally aligned in a planar view, and the electrode section of the image sensor being exposed to outside of the circuit board.

2. The radiation imaging device according to claim 1, further comprising a case which houses all of the scintillator film, the image sensor, and the circuit board, and at least whose radiation incident surface is radiolucent.

3. The radiation imaging device according to claim 1, wherein the electrode section of the image sensor has a plurality of electrodes, and is arranged along with one side of the rectangular-shaped silicon substrate, and
wherein the electrode section of the circuit board lies next to the electrode section of the image sensor.

4. The radiation imaging device according to claim 1, wherein each of a size of the circuit board and a size of the planar scintillator film is smaller than a size of the silicon substrate, whereby the electrode section of the image sensor is exposed to the outside of the scintillator film.

5. A radiation imaging method for acquiring a radiation image as an image signal by using the radiation imaging device according to claim 1, comprising the steps of:
making a radiation image enter the image sensor from a surface opposite a photodetecting section forming surface and transmitting it through the image sensor;
converting the radiation image into an optical image of light with a predetermined wavelength in the scintillator film by radiation that has reached the scintillator film;
detecting the generated optical image by the photodetecting section of the image sensor; and
transmitting the detected image signal from the electrode section of the image sensor to the circuit board arid acquiring it through the circuit board.

6. A radiation imaging device comprising:
a rectangular-shaped planar scintillator film;
an image sensor which has:
  a rectangular-shaped silicon substrate having an X-ray incident surface,
  a photodetecting section in contact with one of the surfaces of the scintillator film being arranged opposite side to the X-ray incident surface, and
  an electrode section exposed to the outside of the scintillator film;
a circuit board having a circuit part and an electrode section both are mounted on one of surfaces of a substrate, the other of the surfaces of the substrate of the circuit board covering whole area of the scintillator film, the circuit board being disposed on the other surface of the scintillator film the electrode section of the circuit board being electrically connected to the electrode section of the image sensor by a wire, the electrode section of the image sensor and the electrode section of the circuit board being laterally aligned in a planar view, and the electrode section of the image sensor being exposed to outside of the circuit board;
a case which houses all of the scintillator film, the image sensor, and the circuit board, and at least whose radiation incident surface is made of a radiolucent material; and
a sheet which is made of a radiolucent elastic material and interposed between an inner surface of the case and the scintillator film.

7. The radiation imaging device according to claim 6, wherein the electrode section of the image sensor has a plurality of electrodes, and is arranged along with one side of the rectangular-shaped silicon substrate, and
wherein the electrode section of the circuit board lies next to the electrode section of the image sensor.

8. The radiation imaging device according to claim 6, wherein each of a size of the circuit board and a size of the planar scintillator film is smaller than a size of the silicon substrate, whereby the electrode section of the image sensor is exposed to the outside of the scintillator film.

* * * * *